United States Patent [19]

Ando et al.

[11] 4,298,446
[45] Nov. 3, 1981

[54] APPARATUS FOR PLATING

[75] Inventors: Masato Ando, Yokohama; Kenji Yamamoto, Komae; Kazuhiro Taniguchi, Hiratsuka, all of Japan

[73] Assignee: Electroplating Engineers of Japan, Limited, Tokyo, Japan

[21] Appl. No.: 141,712

[22] Filed: Apr. 18, 1980

[30] Foreign Application Priority Data

Dec. 29, 1979 [JP] Japan ............................... 54-172185

[51] Int. Cl.³ ..................... C25D 17/02; C25D 17/08
[52] U.S. Cl. ............................... 204/224 R; 204/225; 204/297 W
[58] Field of Search ............. 204/224 R, 225, 297 W, 204/202

[56] References Cited

U.S. PATENT DOCUMENTS

| 3,391,065 | 7/1968 | Gerhard | 204/224 R X |
| 3,763,027 | 10/1973 | Pearson | 204/224 R |
| 3,835,017 | 9/1974 | Mentone et al. | 204/224 R |
| 4,033,844 | 7/1977 | Pantiga et al. | 204/224 R |
| 4,126,533 | 11/1978 | Lukyanchikov et al. | 204/224 R |
| 4,163,704 | 8/1979 | Murata | 204/224 R X |

Primary Examiner—Donald R. Valentine
Attorney, Agent, or Firm—Blanchard, Flynn, Thiel, Boutell & Tanis

[57] ABSTRACT

An apparatus optimum for partially plating such rectangular objects as an IC lead frame obtained by subjecting thin metal pieces to press working and etching. The apparatus is characterized in that a support carriage aligns and supports the plurality of objects to be plated in advance, positioning means align the objects as regards the plating tank the lead wire as a cathode is contacted at the same time with the upper side of each object to be plated and the whole of the plural number of objects to be plated is masked, thereby performing plating by jetting the plating liquid onto respective portions to be plated.

11 Claims, 15 Drawing Figures

APPARATUS FOR PLATING

BACKGROUND OF THE INVENTION

The present invention concerns an apparatus for partially plating a portion of a rectangular object by jetting the plating liquid.

Although there are many apparatuses proposed and practiced for partial plating, particularly those for efficiently conducting partial plating of such objects as an IC lead frame comprising a thin metal piece of a predetermined size, apparatus for handling several objects such as an IC lead frame comprising a thin metal piece of a rectangular shape subjected to press working and etching to obtain a predetermined, comparatively small size is not available in the art as far as the inventors of this invention are aware. The reason for this is that it is difficult to process such a plural number of rectangular objects simultaneously, and it is difficult to improve the processing efficiency of such an apparatus compared to other apparatuses used for other methods of processing, for instance partially processing a long piece of coiled material by rewinding such a coil and partially plating the portion intended for plating while it is being transferred, and cutting the thus plated object into predetermined sizes and shapes.

SUMMARY OF THE INVENTION

When plating a rectangular object as mentioned above, such as an IC lead frame obtained by press working and etching a thin metal piece, it is usually necessary to plate the portion to be plated with gold or other precious metal. It is much more efficient to process a plural number (for instance 10 to 20) of sheets in one batch rather than individually.

For this purpose, it is desirable to align and support a plural number of objects on the carriage in advance, and to determine the descended position of the objects to be plated as regards the plating tanks and to contact the lead wire which is used as a cathode over the upper side of the objects to be plated in such a way as to use it as a mask, thereby facilitating an easy and sure plating processing of a plural number of objects such as partial silver plating.

It is an object of the present invention to provide an apparatus useful for conducting the plating as above mentioned. The present invention is now explained in detail reference being made to the appended drawings. The above and other objects and features of the present invention will be understood in further detail when viewed in the light of the attached drawing wherein FIGS. 1 to 15 illustrate embodiments thereof and the following description.

DETAILED DESCRIPTION OF THE PREFERRED EMBODIMENTS

Figure 2:
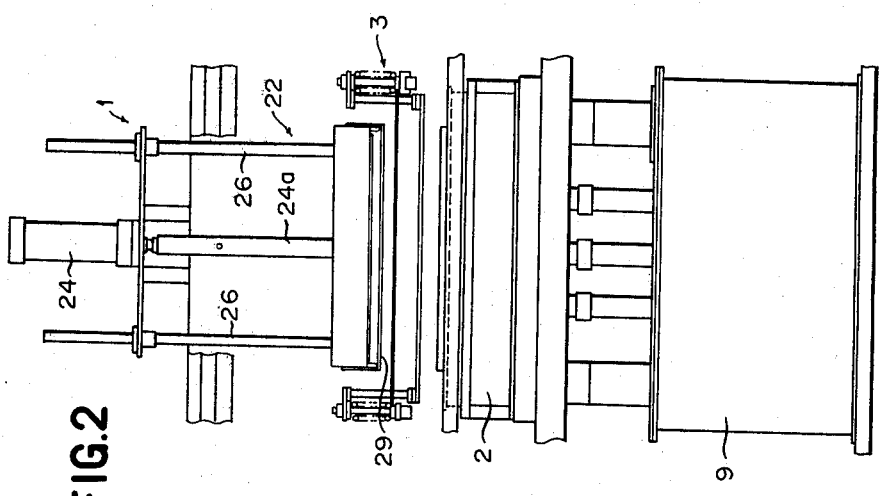
FIG. 2 is an enlarged front view along the line II—II of FIG. 1.
Figure 6:
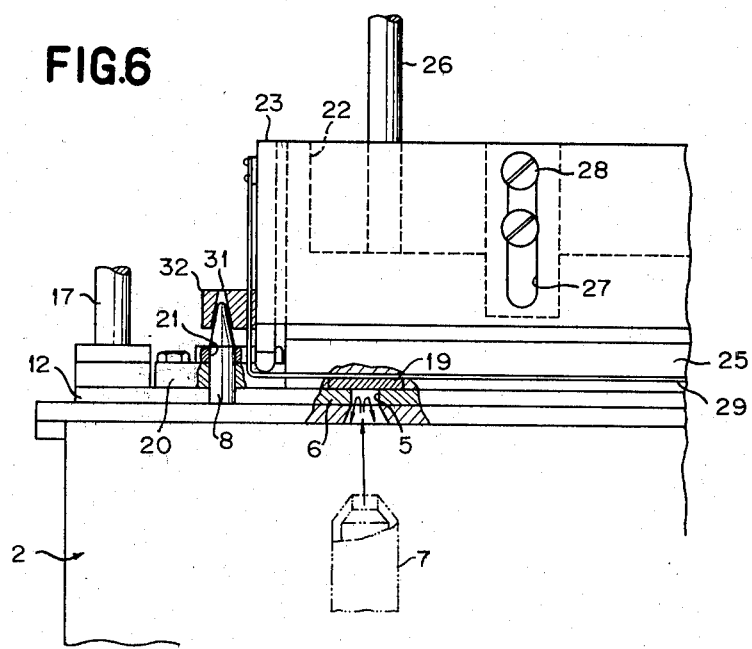
FIG. 6 is a partial front view showing the positioning of the pressure means, the object to be plated and the plating tank.

In referring to the structure of the present invention, the reference number 1 (FIG. 1) denotes a plating apparatus comprising mainly a plating tank 2, a support carriage 3 (FIG. 2) and a pressure means 4. An apparatus commonly known as "Sparger" is used for the plating tank 2. More concretely, the apparatus has a first mask 6 provided with jet apertures 5 as shown in FIG. 6, a nozzle 7 which also acts as an anode, and a projection pin 8 on the upper surface to be used as a positioning means as described hereinafter. The first mask 6 is provided with a plural number of the jet apertures 5, the number of which corresponds to the number of the portions to be plated on the objects 19 to which reference will be made later.

The support carriage 3 (FIG. 7) mainly comprises a carrier base 11 movable along over a pair of rails 10 which extends above the plating tank 2 and a rack base 12 suspended from said carrier base 11. As is evident from the details shown in FIG. 7, a standing bar 13 positioned on the carrier base 11 is provided with a spring 14 and a mobile bush 15 at the top thereof, and said rack base 12 is suspended from the carrier base 11 in a fashion to allow free descent and return to the original position via fixed plate 16 fixed to said mobile bush 15 and a suspension bar 17. The reference numeral 18 denotes a holder for the objects to be plated to receive both ends of said objects 19, while 20 denotes a guide provided with aperture 21 to act as a positioning means.

Figure 9:
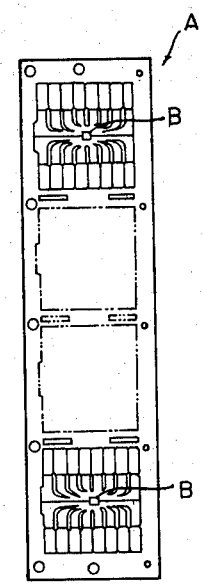
FIG. 9 is a plan view of an IC lead frame which is one example of the objects to be plated.
Figure 10:
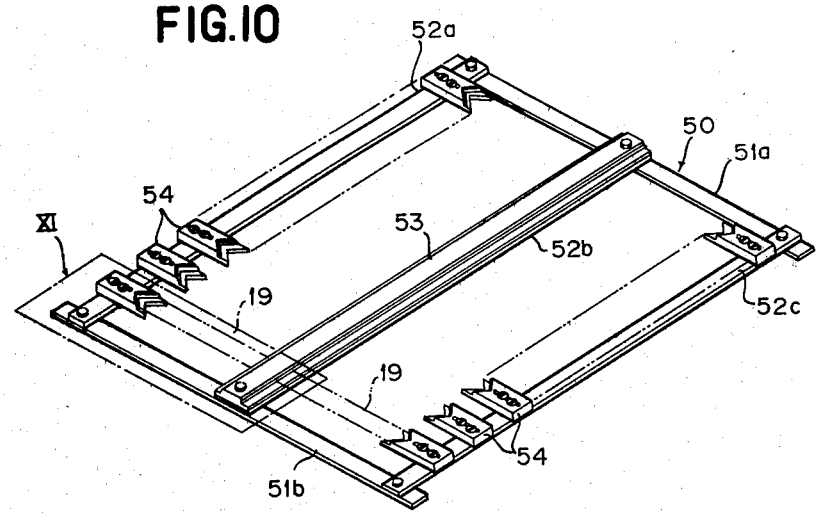
FIG. 10 is a schematic perspective view showing one modification of the rack base of the carriage.
Figure 11:
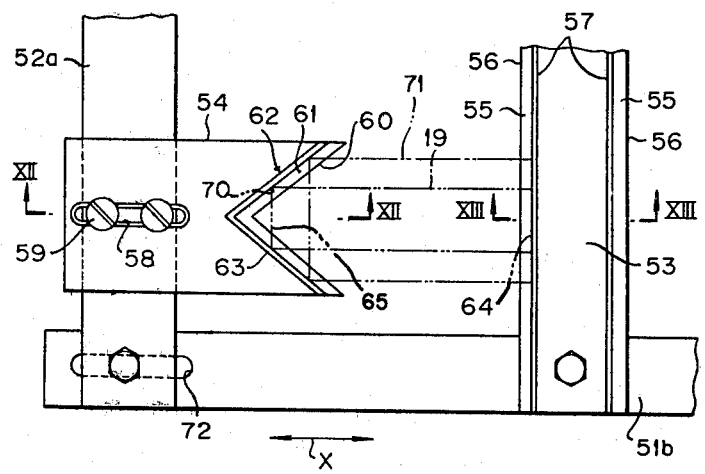
FIG. 11 is an enlarged plan view of the portion designated by the arrow XI in FIG. 10.

The object to be plated 19 in this instance is an IC lead frame A comprising a thin metal piece subjected to press working and etching as shown in FIG. 9. Such IC lead frame usually requires plating using precious metal to be performed at the portion B.

Figure 7:
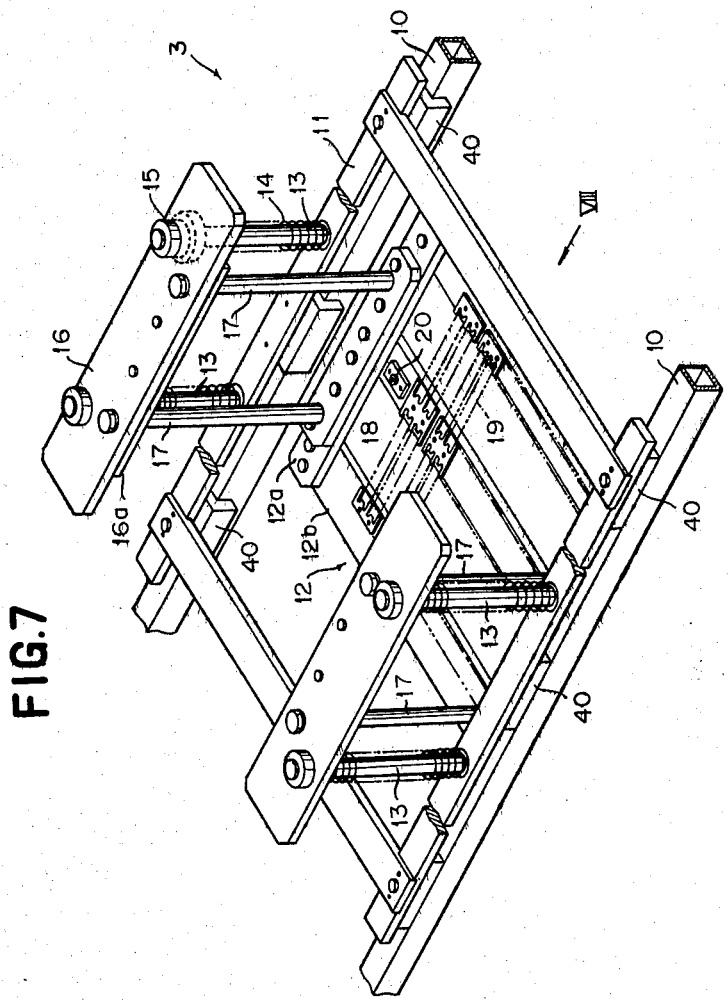
FIG. 7 is a perspective view of the support carriage for the objects to be plated.
Figure 8:
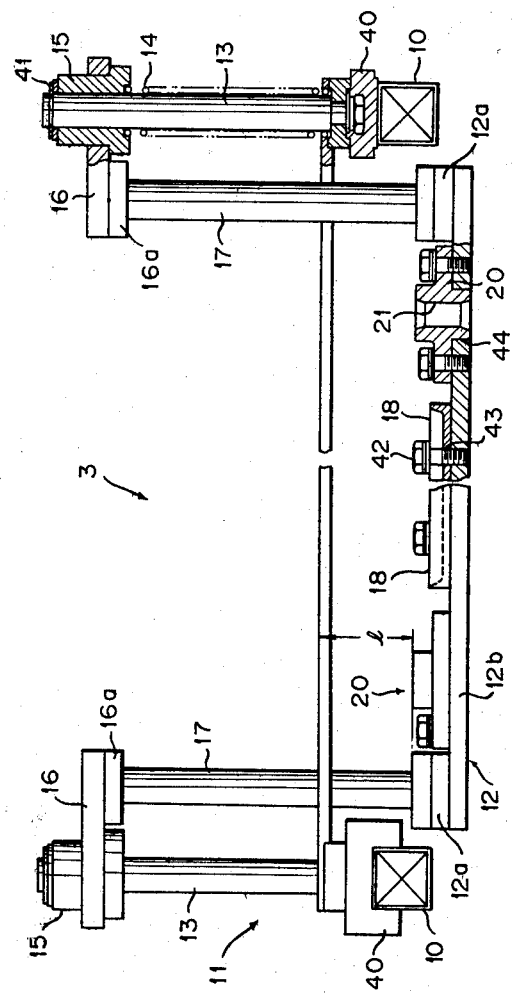
FIG. 8 is an enlarged front view of the carriage as seen from the direction of the arrow VIII in FIG. 7.

In the apparatus in accordance with the present invention the carriage 3 for supporting objects to be plated plays an extremely significant role, and therefore a detailed description of said carriage is given herein below reference being made to FIG. 7 as well as to FIG. 8.

As mentioned before, it is much more efficient to process a plural number (for instance 10 to 20) of sheets in one batch rather than individually. Therefore, it is necessary to align a plural number of objects horizontally in advance, and as the plating operation is conducted over a line comprising various pre-treatments (such as washing with water, degreasing, activation, strike plating, etc.), the plating process proper, and post-treatment (washing with water, washing with hot water, drying, etc.), it is also necessary to transfer the objects which are aligned and supported horizontally and also to facilitate change of the position of the objects vertically up to the height of the surfaces at various steps. The carriage 3 shown in FIGS. 7 and 8 can comply with such a need. More concretely, the support carriage 3 comprises a carrier base 11 and a rack base 12 wherein the rack base 12 is supported in a suspended position, and a plurality of holders 18 are fixed to the rack base 12 in such a way that their positioning is freely adjustable. By installing the positioning means 20 (FIG. 7) on the rack base 12, its applicability is improved greatly and the carriage 3 may be used throughout the entire steps of the plating line with a greater ease in use and manufacture, thereby improving the design freedom of the apparatus for the whole plating line. Such a carriage is shown in FIGS. 7 and 8.

As mentioned above, the carrier base 11 is provided movably on a pair of rails 10 (FIG. 7), has sliders 40 to engage respectively with the rails 10 on the lower surface of the frame shaped carrier base 11, and is further provided with standing bars 13 on the upper surface thereof. The reference numeral 14 denotes a spring provided outside the standing bar 13, the lower end of which abuts against the upper surface of the carrier base 11, and the upper end abuts against the mobile bush 15 encircling the upper portion of the standing bar 13. The mobile bush 15 is prevented from becoming loose from the standing bar 13 by the stopper ring 41 (FIG. 8).

The rack base 12 is suspended from the carrier base 11 as above described and becomes lowered following the pressure applied from another source, and it elevates and returns automatically when the pressure is removed. In other words, the rack base 12 shaped like a frame has opposing sides 12a connected to said mobile bush 15 via the bush plates 16, 16a and the suspension bar 17. The rack base 12 is suspended between two carrier bases 11 and below said carrier bases 11 so that the length of the suspension bar 17 is longer by the distance l than the standing bar 13. The rack base 12 has cross bars [three in the drawing] 12b upon which are to be fixed holders 18 for objects to be plated. Each holder 18 comprises sectioned pieces instead of one long piece, and a plurality of these sections are to be fixed to the cross bars 12b. They are provided with concave portions of a size and shape adapted to receive the end portions of the objects 19. In the embodiment illustrated, there is shown a holder which is to be attached by placing the same on the center cross bar upon which are formed concave portions on the opposing two sides. On the other hand, the holder to be attached to the two cross bars on both sides of the center cross bar has a concave portion only on one of the opposing sides. These holders 18 are to be fixed upon the cross bars 12b by screws 42 individually, and the fine adjustment for their positions may be made by giving the hole 43 for screws, a size somewhat bigger than that of the screw 42. [See FIG. 8]. This fine adjustment is suitably conducted depending on such conditions as the degree of parallelism of the holders 18, the degree of opposing distance, etc. the position of the opening 5 in the first mask 6 of the plating tank 2 mentioned hereinbefore, and other conditions. For this reason there is provided a clearance between the holders 18 and 18, and other holders also are attached with such a clearance therebetween.

The reference numeral 20 is a guide for "positioning means for descent" provided on the rack base 12. In other words, there is formed a through hole 44 on the cross bar 12b of the rack base 12 through which is inserted and fixed a guide 20, the opening 21 thereof being adapted to engage with a pin 8 extendingly provided on the upper surface of the plating tank 2 mentioned above. [See FIG. 6].

Figure 5:
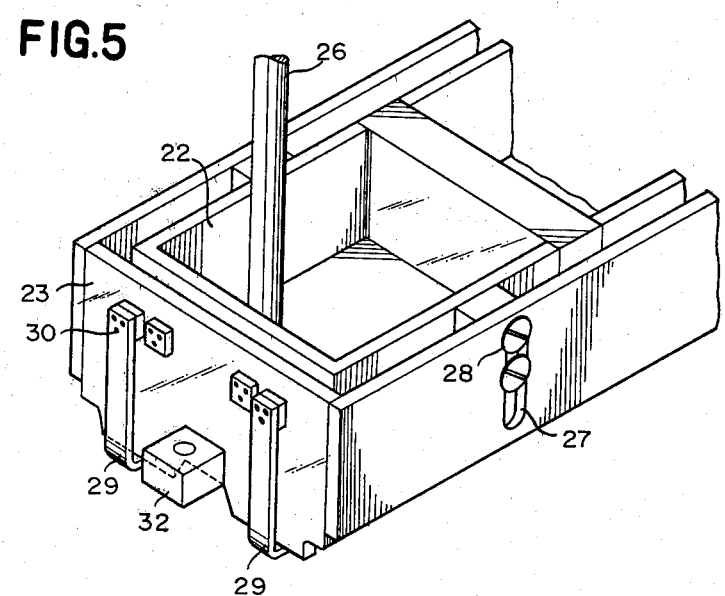
FIG. 5 is a partially perspective view of the pressure means.

The pressure means 4 comprises mainly of a pressure member 22 and its case 23 (FIG. 5). The pressure member 22 is attached to the lower end of the rod 24a of the pressure cylinder 24 (FIG. 1), and is provided with the second mask 25 which freely contacts the upper surface of the objects 19 (FIG. 6). The reference numeral 26 denotes the guide bar. The second mask 25 is preferably made of a material having soft elasticity. The case 23 encircles the side surface of the pressure member 22 and is engaged with a pressure member 22 by a screw 28 which goes through the orifice 27. Accordingly, the case is movable in respect of the pressure member 22 in a vertical direction by the length of the orifice 27. Between two sides of the case 23 is extended a lead wire 29 in the shape of a belt which functions as a cathode below said second mask 25. The position of the lead wire 29 at which it is attached to the case 23 is movable and is such that the lead wire may be attached at an optimum position on the upper surface of the objects 19 to be plated in respect of the case 23. The reference numeral 30 denotes a screw to attach the lead wire 29. On the outer side of the case 23 is provided a means to position the means 8 with respect to the plating tank 2, which in the embodiment shown is a bush 32 provided with an opening 31.

The operation of the apparatus is now explained. In the state where the support carriage 3 is positioned above the plating tank 2, the pressure cylinder 24 positioned further above is activated. The pressure member 22 attached to the lower end of the rod 24a descends and the case 23 is lowered because it is suspended from the pressure member 22. The support carriage 3 then is lowered, or more concretely the pressure member 22 abuts the rack base 12 and presses it down. At this time, the lead wire 29 contacts the upper surface of the object 19, and if the object 19 is unsuitably supported by the holders 18 for the objects to be plated, then the position of the object 19 is corrected to be suitable in respect of the holder 18.

At the lowest position of movement, the projecting pin 8 becomes engaged with the means for positioning 20 and 32 as shown in FIG. 6, thereby positioning the objects to be plated 19 to be in suitable positions in respect of the jet holes 5 of the first mask 6. With the upper surface of the plurality of the objects 19, the lead wire 29 contacts and the second mask 25 abuts the non-contacting portions of the lead wire 29 with its soft elasticity acting properly. In this state, the plating liquid is jetted from the nozzle 7 which also acts as an anode and performs partial plating on the lower surface of the object 19 which is exposed through the jet hole 5, for instance silver plating.

Upon completion of the plating process, the pressure cylinder 24 acts to raise the pressure member 22. The bottom of the second mask 25 first detaches itself from the upper surface of the object to be plated 19, and then the lead wire becomes detached therefrom. Accordingly, the object 19 moves attached to the second mask 25 and does not become free from the holder 18. As these pressure means 4 are raised, the rack base 12 returns to its original position or ascends, and is sent to the next plating step, for instance silver peeling, over the rail 10. At this time, another support carriage which has gone through the pre-treatment, for instance washing with water, is transferred to a position directly above the plating tank 2 to repeat the above mentioned operation.

The modified example of the support carriage 3 is now explained reference being made to FIGS. 10 to 15 wherein only the rack base and its accessories are shown while the carrier base and others are not shown.

The carriage, or more concretely its rack base generally, comprises a fixed holder and a mobile holder to support the objects to be plated, and there is provided a continuous step portion in the longitudinal direction on the fixed holder, while there is provided a concave portion with a step on the mobile holder to improve the multi-use of the rack base in supporting objects with different widths and lengths.

The structure of the carriage is now explained; the reference numeral 50 denotes a rack base shaped like a frame comprising a pair of opposing sides 51a, 51b and three cross bars 52a, 52b and 52c. One of the cross bars, the bar at the center 52b in the embodiment shown, is provided with a fixed holder 53, while the other cross bars, those on both sides, 52a and 52c, in the embodiment shown are provided with plurality of mobile holders 54.

The fixed holder 53 may be constructed by joining a plural number of sections over the cross bar 52b, or alternately one long piece may be placed over the cross bar 52b. If one long piece of fixed holder 53 is to be used, the cross bar 52b itself may be formed as a fixed holder 53 instead of placing it on the cross bar 52b. On the fixed holder 53 is formed a support step 55 continuing in the longitudinal direction on the opposing side 56 (FIG. 13). 57 denotes a sloping guide for facilitating the setting of the object 19 to be plated.

The plural number of mobile holders 54 are identically shaped and structured, and the following description is given in respect of one mobile holder 54. The mobile holder 54 (FIG. 11) is provided movably in respect of its position in the longitudinal direction of the objects 19 over the cross bars 52a and 52c. For facilitating the change of positions, the mobile holder 54 has an orifice 58 through which are inserted two stopper screws 59 screwed to the lower ends of the cross bars 52a and 52c. When these screws 59 are removed, the mobile holder 54 may be freely replaced with other type.

The mobile holder 54 further forms a concave portion 62 provided with a support step 61 on the opposing sides 60. It is possible to shape the concave portion 62 like a bow instead of a triangle as shown in the drawing. The reference numeral 63 is for a sloping guide for facilitating setting of the objects 19 to be plated.

Figure 12:
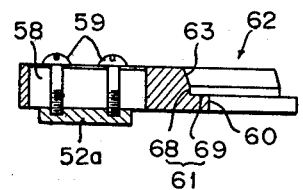
FIG. 12 is a cross sectional view along the line XII—XII of FIG. 11.
Figure 13:
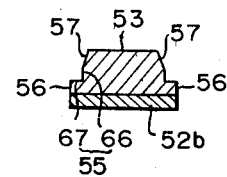
FIG. 13 is a cross sectional view along the line XIII—XIII in FIG. 11.

The operation of the holder is now explained. In order to align and set a plurality of objects 19 on the rack base, one end 64 of the object 19 may be positioned on the support step 55 and the other end 65 on the support step 61. One end of the object 19 is received by the elevated portion 66 (FIG. 13) and the horizontal portion 67 of the support step 55 while the other end 65 is received by the elevated portion 68 and the horizontal portion 69 (FIG. 12). Looking at this structure from above (FIG. 11), the corner 70 of the other end 65 is snugly inserted into a triangular concave portion 62. This triangular concave portion 62 can receive objects 19 having different lengths and widths, and if the two stopper screws 59 are somewhat loosened and the mobile holder 54 is moved in the direction of the length of the objects 19, 71 utilizing the orifice 58, still more suitable support for various objects 19, 71 may be obtained. If there is formed a second orifice 72 in the direction of X at the positions where the opposing sides 51a, 51b cross the cross bars 52a, 52b and 52c, adjustment both for the above mentioned orifice 58 and the second orifice 72 becomes possible.

Figure 1:
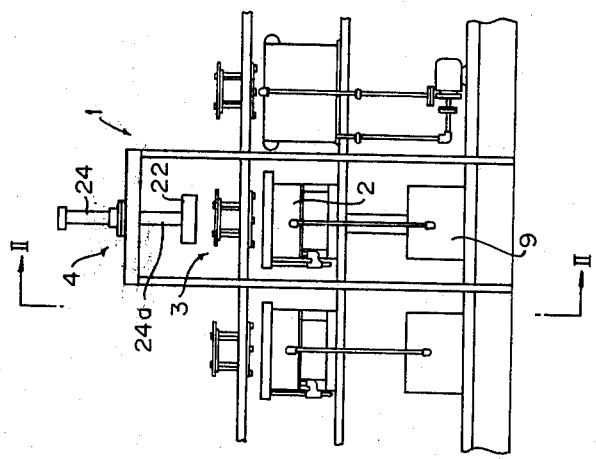
FIG. 1 is a side view illustrating an embodiment of a plating apparatus.
Figure 3:
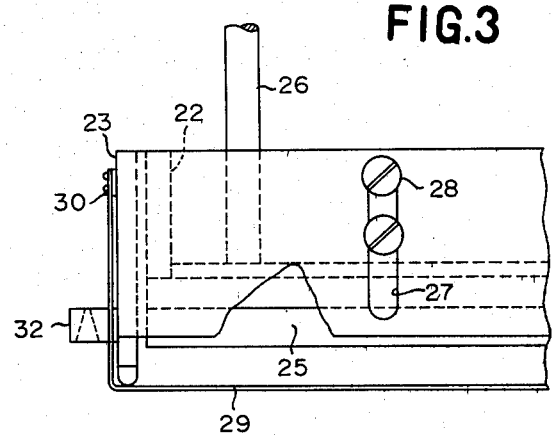
FIG. 3 is a partially enlarged front view of the pressure means.
Figure 4:
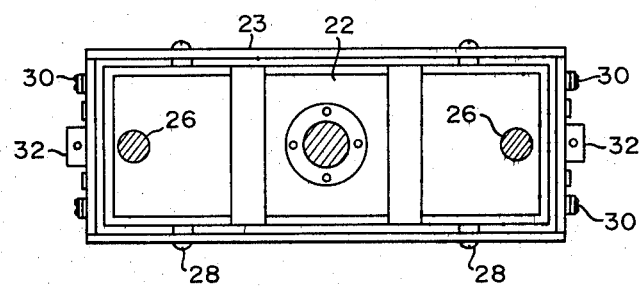
FIG. 4 is a plan view of the pressure means.
Figure 14:
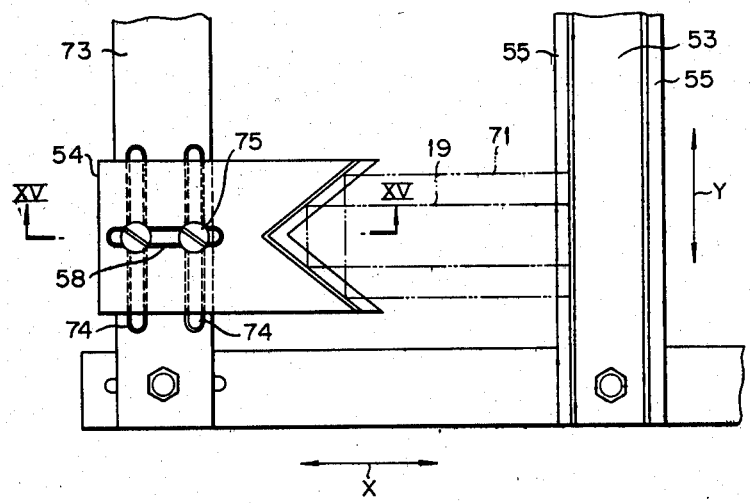
FIG. 14 is a partial plane view of still another modification of the rack base shown in FIG. 10.
Figure 15:
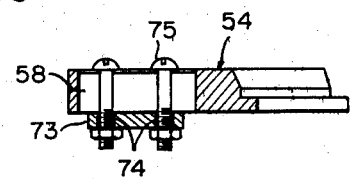
FIG. 15 is a cross sectional view along the line XV—XV of FIG. 14.

Another embodiment of the present invention is shown in FIGS. 14 and 15. This embodiment provides the mobile holder 54 is supported movably in the direction of the width Y of the objects 19, 71 to be plated. In other words, two slits 74 are formed on the cross bar 73, and stopper screws 75 passing through the orifice 58 of the holder 54 and said slits 74 are used. According to this embodiment, the mobile holder 54 may be moved in the direction of the width Y in addition to that of the length X of the objects 19, 71. When the holder 54 is moved in the direction of the width Y, the one end of the objects 19, 71 may be supported at an arbitrary position along the support step 55 which is continuously provided in the direction of the length of the fixed holder 53, thereby facilitating positioning of the objects 19, 71 against the plating tank 2 as shown in FIGS. 1 and 6 at desired positions in the horizontal direction.

As has been explained above, the present invention comprises the plating tank having positioning means and having nozzles jetting the plating liquid over the portion to be plated on the object to be plated;

A support carriage provided with a carrier base is engaged movably with a pair of rails which extend above the plating tank, and a rack base having a holder for objects to be plated is suspended and supported from the carrier base in a manner to allow ascent and descent freely;

A pressure means is provided with a pressure member having a mask on its bottom which freely contacts the upper surface of the objects to be plated and being attached to the lower end of the rod of the pressure cylinder, and with a case which encloses the side of the pressure member and is attached thereto with its length in the vertical direction made to be movable, the case having a positioning means provided on the outer side to cooperate with the positioning means of the plating tank, and a lead wire intended as a cathode extends below said mask between the two outer sides of the case with its position variable. Thus, it is quite easy to align the position by the object to be plated as regards the plating tank, and to speedily conduct the plating, particularly partial plating by jetting the plating liquid, as the lead wire as a cathode is contacted with the upper surface of the object to be plated and as the whole object is pressed downwardly by the mask. Any irregularities in the alignment and support of the plurality of objects to be plated may be suitably corrected by the mask provided in the pressure member and the lead wire provided in the case. As the mask ascends before the lead wire, the latter acts to hold down the objects to be plated and prevents them from ascending with the mask, it is quite useful for the plating process where a plurality of rectangular shaped objects to be plated are processed at one time.

In addition to the above mentioned advantages, the support carriage may be used to keep the descending distance for the holder long as well as to cause the same to abut against the first mask in the plating tank, and to cause the same to enter into the plating tank, if necessary. Thus, the diverse utility of the apparatus results in the plating line where various types of plating tanks are combined, thereby increasing the design freedom for the apparatuses for the whole plating line and also facilitating easier use because of the fine adjustment made possible for positioning of the holders.

When the rack base for the support carriage is constructed as shown in FIGS. 10 to 15, the fixed holder can support one end of the objects having different sizes and widths while the mobile holder can support the corner portions of the other end of the objects having different widths and/or lengths in the concave portion. Thus, the apparatus can support diversified types and shapes of objects to be plated, and can easily adjust the position of the objects as against the plating tanks, or more directly the jet holes on the first mask, thereby greatly enhancing the utility value of the apparatus.

What we claim is:

1. An electroplating apparatus, comprising:
   a plating tank having a first mask on the upper side thereof for engaging the lower surface of the object or objects to be plated, said first mask having opening means therethrough with said opening means having a configuration corresponding to the plating deposit to be made on the object or objects to be plated, nozzle means for jetting the plating liquid through said opening means and against said lower surface of the object or objects to be plated, said nozzle means being adapted to be connected as the anode of an electroplating circuit, said plating tank having positioning means on the upper side thereof;
   a pair of elongated rails supported above said plating tank;
   a support carriage, said support carriage comprising a carrier base supported on said rails for movement therealong and a rack base suspended from and supported on said carrier base for upward and downward movement with respect to said carriage base in directions away from and toward said plating tank, said rack base having holding means for holding the object or objects to be plated;
   pressure means disposed above said rack base for moving said rack base downwardly and upwardly toward and away from said plating tank, said pressure means comprising a pressure member having a second mask on its bottom, said second mask being adapted to contact the upper surface of the object or objects to be plated which are held in said holding means, a fluid pressure operated piston and cylinder assembly disposed above said pressure member and having a rod connected to said pressure member for moving same upwardly and downwardly, said pressure means also including a case surrounding said pressure member and connected thereto for limited relative vertical movement with respect thereto, said case having means engageable with said positioning means on said plating tank when said pressure means is in its lowermost position for positioning the said holding means and thereby the object or objects to be plated in proper position with respect to said first mask and said opening means therein, said pressure means having at least one lead wire extending along the lower surface of said second mask for contacting the upper surface of the object or objects to be plated, said lead wire being adapted to be connected as the cathode of said electroplating circuit.

2. An electroplating apparatus as claimed in claim 1 in which said carrier base has sliders on opposite sides thereof for slidably engaging said rails, a plurality of standing bars extending upwardly from said carrier base, each standing bar having a coil spring therearound and a bush slidably mounted on its upper end so that said coil spring urges said bush upwardly, said rack base having a plurality of suspension bars each connected to one of said bushes so that said coil springs resiliently urge said rack base upwardly, said rack base having a plurality of cross bars, said holding means comprising a plurality of holders adjustably mounted on said cross bars.

3. An electroplating apparatus as claimed in claim 1 or claim 2 in which said rack base is a frame comprised of a pair of opposing sides and a plurality of cross bars extending between said sides, one of said cross bars being provided with a fixed holder formed with a support step which extends continuously in the lengthwise direction of said one cross bar, another of said cross bars having a second holder mounted thereon for adjustment toward and away from said fixed holder, said second holder having a concave portion opposed to said fixed holder, said concave portion having a support step portion whereby the position of the object or objects to be plated can be adjusted.

4. An electroplating apparatus, comprising:
   a plating tank;
   a rack base for supporting the object or objects to be plated, and means supporting said rack base for reciprocal vertical movement between positions adjacent to and spaced from the top of said plating tank;
   means on said rack base for holding the object or objects to be plated in a predetermined position;
   means in said plating tank for directing a jet or jets of the plating liquid over the portion of each object which is to be plated when said rack base is in said adjacent position;
   pressure means for effecting said vertical movement of said rack base, including a pressure cylinder having a piston rod and a pressure member secured to the lower end of said piston rod and having a mask on the undersurface thereof engageable with the upper surface of the object or objects on said rack base to be plated, whereby movement of said piston rod acts through said pressure member to move said rack base to said adjacent position; and
   at least one lead wire supported beneath said mask, said lead wire being in electrical contact with the object or objects to be plated when said mask is engaging the upper surfaces of the object or objects.

5. The apparatus of claim 4, wherein said means supporting said rack base comprises a pair of parallel and horizontally extending rails supported above said plating tank and a support carriage slidably supported on said rails for movement therealong, said rack base being part of said support carriage.

6. The apparatus of claim 5, wherein said support carriage includes;
   a carrier base slidably resting on said rails and having a plurality of standing bars extending upwardly therefrom;
   a plurality of bushes, each said bush having an opening therein through which a respective said standing bar extends, said bushes being reciprocally slidable vertically along said standing bars and said rack base being connected to said bushes for movement between said adjacent and spaced positions as said bushes slide reciprocally on said standing bars; and a helical spring encircling each said standing bar and compressed between said bush and said carrier base for continuously urging said rack base upwardly toward said spaced position.

7. The apparatus of claim 4, including positioning means for aligning said pressure member, said rack base and said plating tank with respect to each other as said rack base is moved to said adjacent position.

8. The apparatus of claim 4, wherein said pressure means includes a case which encircles the sides of said pressure member and is secured thereto for relative vertically slidable movement of limited extent.

9. The apparatus of claim 8, wherein the respective ends of said lead wire are secured to opposite sides of said case.

10. The apparatus of claim 4, wherein:

said rack base includes a pair of spaced, parallel side members and a plurality of spaced parallel cross bars extending between said side members; and said holding means is provided on said cross bars and includes a plurality of pairs of holder members, one said holder member of each said pair being adjustably mounted on one said cross bar and the other holder member of each pair being mounted on an adjacent said cross bar, said other holder member having a concave portion on the side thereof facing the said one holder member associated therewith.

11. The apparatus of claim 4, wherein:

said rack base includes a pair of spaced, parallel side members and a plurality of spaced, parallel cross bars extending between said side members; and said holding means is provided on said cross bars and includes a support step provided on one said cross bar which extends lengthwise therealong and faces an adjacent said cross bar, and also includes at least one holder member adjustably mounted to said adjacent cross bar and having a concave portion which faces said support step.

* * * * *